United States Patent [19]
Sekiguchi

[11] Patent Number: 5,241,417
[45] Date of Patent: Aug. 31, 1993

[54] MULTI-LAYERED OPTICAL FILTER FILM AND PRODUCTION METHOD THEREOF

[75] Inventor: Toshisada Sekiguchi, Tokyo, Japan

[73] Assignee: Copal Company Limited, Tokyo, Japan

[21] Appl. No.: 650,247

[22] Filed: Feb. 4, 1991

[30] Foreign Application Priority Data

| Feb. 9, 1990 | [JP] | Japan | 2-30420 |
| Mar. 26, 1990 | [JP] | Japan | 2-76305 |
| Mar. 26, 1990 | [JP] | Japan | 2-76306 |
| Apr. 25, 1990 | [JP] | Japan | 2-109306 |

[51] Int. Cl.$^5$ ............................ G02B 5/20; G02B 5/28
[52] U.S. Cl. .................................. 359/586; 359/580; 359/588; 359/589
[58] Field of Search ............... 359/586, 587, 588, 589, 359/590, 580, 585

[56] References Cited

U.S. PATENT DOCUMENTS

| 3,551,017 | 12/1970 | Iwasaki et al. | 359/589 X |
| 4,937,134 | 6/1990 | Schrenk et al. | 359/580 X |
| 4,940,636 | 7/1990 | Brock et al. | 359/586 X |
| 5,044,736 | 9/1991 | Jaskie et al. | 359/589 X |

*Primary Examiner*—Constantine Hannaher
*Assistant Examiner*—Edward J. Glick
*Attorney, Agent, or Firm*—Sixbey, Friedman, Leedom & Ferguson

[57] ABSTRACT

The optical filter is comprised of a thin film having a multi-layered structure free of a substrate. The multi-layered structure is composed of alternately superposed high refractivity layers and low refractivity layers with one another. Each layer has a dense composition effective to prevent absorption of water and exhibiting substantially the same internal stress. In production of the thin film, there is utilized a substrate soluble to a certain solvent. An optical material of high refractive index and another optical material of low refractive index are alternately deposited by accelerated energy particles on the substrate surface to form a thin film of multi-layered structure. Lastly, the substrate is dissolved into the solvent to separate the thin film to form the optical filter free of the substrate.

8 Claims, 12 Drawing Sheets

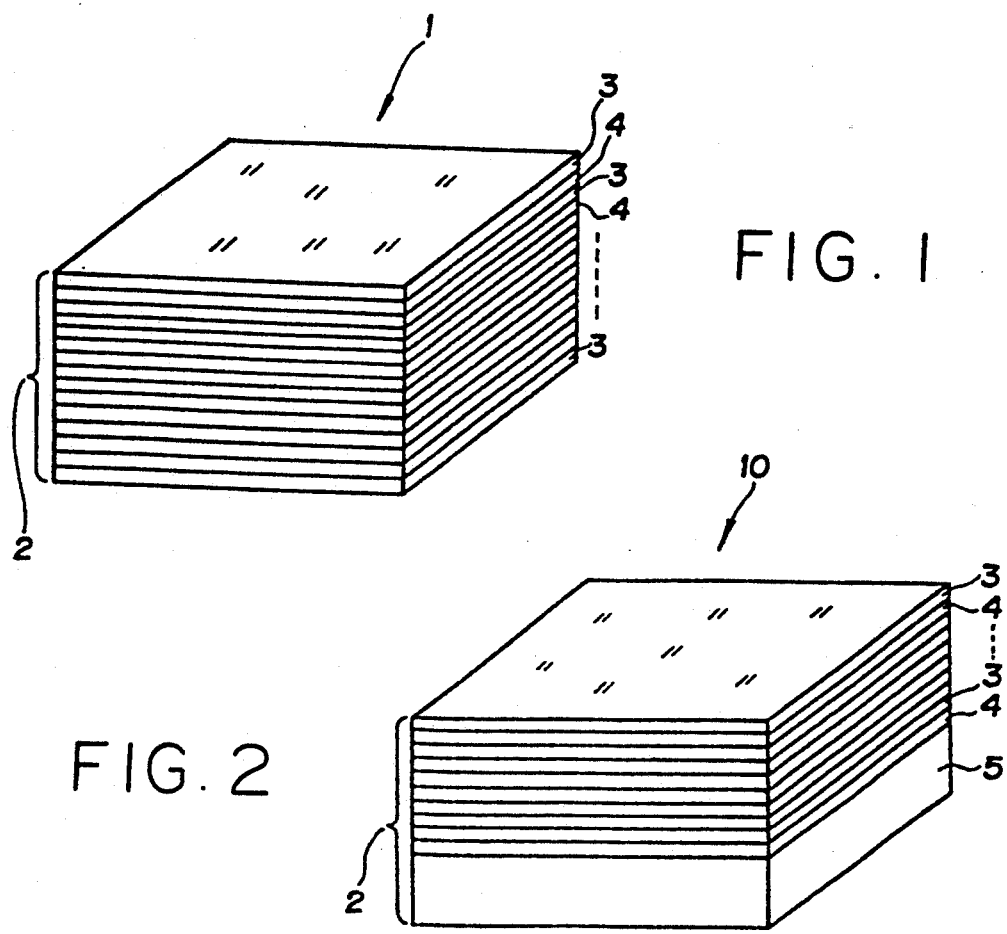
FIG. 1
FIG. 2
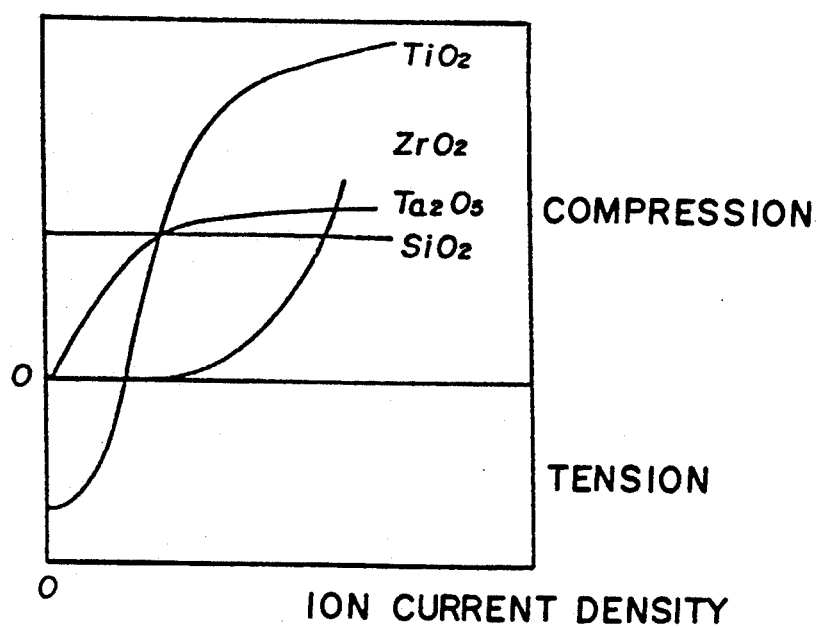
FIG. 3

MULTI-LAYERED OPTICAL FILTER FILM AND PRODUCTION METHOD THEREOF

BACKGROUND OF THE INVENTION

The present invention relates to a multi-layered optical filter film and production method thereof. More specifically, the present invention relates to thin film filter chips used as optical multiplexers and demultiplexers in optical communication systems.

Generally, an optical filter device is composed of a multi-layered thin film and utilizes interference of incident light in a multi-layered structure to selectively pass or transmit a particular wavelength range of the light. The conventional film filter device has a multi-layered structure of non-metal materials having different refractive indexes, formed on a glass substrate by vacuum evaporation. Each layer has a given thickness and a different refractive index set to form a filter having a specific filtering characteristic for a given wavelength.

Such film filter devices are generally utilized as multiplexers and demultiplexers in optical multi-communication systems. The multiplexer or demultiplexer is inserted in a branching point of a light guide network comprised of an optical fiber to effect spectral composition or separation. Therefore, the multiplexer and demultiplexer has a very small dimension and a very small film thickness on the order of several tens of micrometers to avoid light loss.

The conventional multiplexer and demultiplexer has a multi-layered film structure formed by superposing alternately optical dielectric materials having different refractive indexes on a glass substrate having a thickness of several tens of micrometers by means of regular vacuum evaporation. In production of such a filter device, after vacuum-evaporating the multi-layered film on a thick glass substrate having a thickness of several millimeters, the glass substrate is polished to reduce its thickness, and then the substrate is cut into chips of several millimeters square. Otherwise, the multi-layered film is deposited on thin glass substrate which is provisionally polished to a thickness of several tens of micrometers.

SUMMARY OF THE INVENTION

However, the conventional multiplexer and demultiplexer filter has the multi-layered structure deposited by evaporation, hence the film has a porous structure which causes the drawbacks of low durability and particularly low water vapor resistance. Namely, the porous film tends to absorb water or alcohol so that transmission frequency characteristics of the filter are fluctuated to impair accurate multiplexing and demultiplexing, thereby causing noise in a multi-communication system. In view of the above noted drawbacks, a first object of the present invention is to provide a multi-layered thin film optical filter device having a very small size and a very small thickness, which exhibits a good durability or water resistant feature. In order to achieve the first object, the inventive device utilizes a multi-layered structure having a dense composition which is effective to avoid absorption or adsorption of water, etc.

If the multi-layered film of dense composition were fixed on a glass substrate and then the glass substrate were polished to several tens of micrometers of the thickness to produce a very thin optical filter in a similar manner to the conventional method, the dense multi-layered film would impose a strong internal compression stress on the glass substrate thereby destroying the glass substrate during the polishing process. Further, even if the substrate were polished without destruction, the thin glass substrate would be deformed due to strong internal compression, which would hinder practical use of the filter device. In view of such difficulty, a second object of the present invention is to produce a thin film optical filter device composed of a dense multi-layered structure having good durability without destruction and deformation.

According to the first aspect of the invention, the optical filter device is comprised of a thin film which is free of a support or substrate, and which has a multi-layered structure composed of alternately superposed high refractivity layers and low refractivity layers. The high refractivity layers are composed of an optical material having a relatively great refractive index and dense composition effective to prevent absorption of water and in turn inducing a certain internal stress. On the other hand, the low refractivity layer is composed of another material having a relatively small refractive index and dense composition similarly effective to prevent absorption of water and inducing substantially the same internal stress as that of the high refractivity layer.

According to the second aspect of the invention, the method of producing an optical filter film includes a preparation step of providing a temporary support or substrate which is soluble to a given solvent. Then a deposition step is carried out to alternately deposit an optical material of high refractive index and another material of low refractive index on the soluble substrate to form a multi-layered thin film. Lastly, the soluble substrate is dissolved into the given solvent to remove or separate the thin film to form a filter device free of the substrate.

The inventive filter device of the thin film type is comprised of the multi-layered structure having dense, tight or minute composition to improve durability and particularly water-resistance. Further, the high refractivity layer and the low refractivity layer have substantially the same internal stresses to avoid accumulation of internal strain between the adjacent layers to ensure stability of dimension and shape of the device.

According to the inventive method, the optical filter device can be obtained in the form of a multi-layered film which is separated from a support. Therefore, the optical filter device can be mass-produced at high yield rates because the internal stress does not occur between the film and the glass support as opposed to the prior art.

BRIEF DESCRIPTION OF THE DRAWINGS

FIG. 1 is a perspective view showing a first embodiment of the multi-layers thin film optical filter device;

FIG. 2 is a perspective view showing a second embodiment of the thin film filter device;

FIG. 3 is a graph showing the relation between internal stress of a deposited film layer and ion current density;

DETAILED DESCRIPTION OF THE INVENTION

Figure 4:
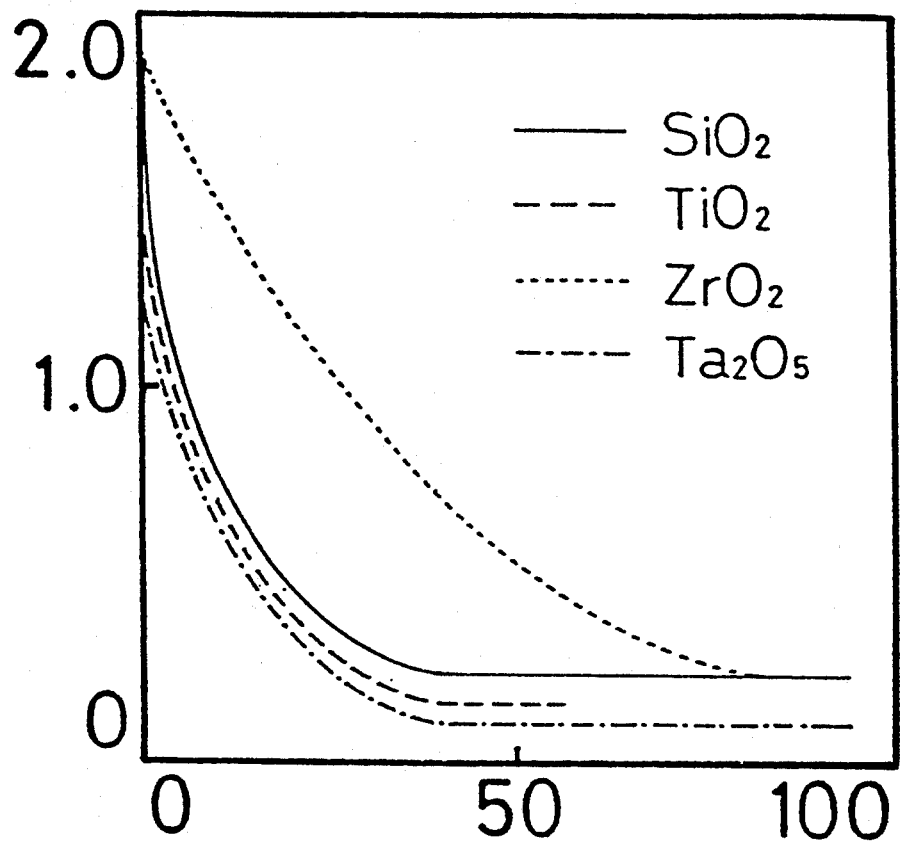
FIG. 4 is a graph showing the relation between wavelength shift of an optical thin film and ion current density.

Hereinafter, the invention will be described in detail with reference to the drawings. FIG. 1 shows a first embodiment of the inventive optical filter device of the multi-layered film type. As shown in the figure, the optical figure device 1 is composed of a multi-layered film 2 free of a support. However, it should be noted that the optical filter device 1 may be arranged in combination with other optical members or optical elements in actual use. The multi-layered film 2 is comprised of high refractivity layers 3 and low refractivity layers 4 superposed with one another to form the multi-layer structure. Each high refractivity layer 3 is composed of an optical material or dielectric material of relatively high refractive index having a dense microstructure effective to avoid absorption of water and alcohol and in turn exhibiting a certain internal stress. Each low refractivity layer 4 is composed of another optical material having a dense microstructure effective to prevent absorption of water etc., and in turn inducing substantially the same internal stress as that of the high refractivity layer 3. The refractive index and the thickness of the individual layers are suitably set to produce the multi-layered thin film 2 having a desired filtering feature or a desired selectivity of the light frequency. In this embodiment, the optical filter device 1 has an area dimension of several millimeters square and a film thickness of several tens of micrometers for use as an optical multiplexer and demultiplexer of the optical multi-communication system. For example, the multi-layered film 2 has sixty high refractivity layers 3 and low refractivity layers 4 each having 0.25 $\mu$m of thickness such that the film 2 has 15 $\mu$m of the total thickness.

The high refractivity layer 3 is composed of an optical material of high refractive index such as $Ta_2O_5$, and the low refractivity layer 4 is composed of another optical material of low refractive index such as $SiO_2$. These optical or dielectric materials are superposed on one another by a deposition process with the assistance of accelerated energy particles to form a dense microstructure effective to shut water vapor and other vapors such as alcohol. The deposition process is carried out by, for example, an ion-assist vacuum evaporation method.

FIG. 2 shows a second embodiment of the inventive optical filter device. As shown in the figure, the optical filter device 10 is comprised of a separated multi-layered film 2 similar to the first embodiment. In this embodiment, the film 2 includes an adjusting layer 5 beside high refractivity layers 3 and low refractivity layers 4 are superposed on each other. This adjusting layer 5 has a thickness adjustively set to obtain a desired total thickness of the multi-layered film 2. Adjusting layer 5 has an adjusting function for the multi-layered film 2, and multi-layered film 2 has a filtering function. The adjusting layer 5 is composed of, for example, the same optical material as that of the low refractivity layer 4, and may have also a dense composition effective to block water vapor etc.

Next, referring to FIG. 3, a description is given for physical features of the inventive optical filter device. The FIG. 3 graph indicates internal stress in a single layer formed by depositing various optical or dielectric materials on a glass substrate by an ion-assist vacuum evaporation method. The vertical axis denotes magnitude of internal stress per unit volume where the upper side relative to the zero line indicates compression internal stress and the lower side relative to the zero line indicates tension internal stress. The compression internal stress acts to apply compressive strain to the junction face of the glass substrate. On the other hand, the tension internal stress acts to apply tension strain to the junction face of the glass substrate. The horizontal axis denotes ion current density of assist ions used in the ion-assist vacuum evaporation method. This method is carried out by irradiating accelerated energy particles in the form of ions onto a target surface during the course of the evaporation to bombard the evaporated film to form a dense composition. Accordingly, the greater the ion current density, the more the density of the evaporated film. Such an ion assist vacuum evaporation method can be effectively utilized to form a refractive layer having a dense composition effective to prevent absorption of water. Oxygen ions may be selected as the accelerated ion particles when using oxides as an optical material of the refractive layer. As shown in the FIG. 3 graph, when the ion current density were set to zero, i.e., when the regular or conventional vacuum evaporation were carried out without ion assist, the high refractive material of $TiO_2$ would exhibit tension internal stress and the low refractive material of $SiO_2$ would exhibit substantially the same magnitude of compression internal stress. Therefore conventionally, $TiO_2$ and $SiO_2$ are alternately deposited on a glass substrate by regular vacuum evaporation so as to form the optical filter device. The tension internal stress of $TiO_2$ and the compression internal stress of $SiO_2$ cancel each other so that substantially no stress will be applied to a glass substrate. However, the regular evaporation method would not increase the density of the evaporated and deposited layer, which would therefore be porous, thereby causing absorption of water to degrade water-resistance of the film. On the other hand according to the invention, the ion-assist evaporation method is utilized to form a dense deposition layer. As shown in the FIG. 3 graph, when the density of the deposition layer is increased, any of the refractive layers composed of various dielectric materials exhibit strong compression internal stress. Therefore, it would be quite difficult to deposit refractive layers having strong compression internal stress on a thin glass substrate in a manner similar to the prior art. The strong compression internal stress would cause destruction or deformation of the glass substrate. In view of this, according to the invention, the optical filter device is removed from the support or substrate and is made free of the substrate. Particularly, ion current density can be optimally regulated during the course of the ion-assist evaporation to equalize the magnitudes of the compression internal stresses in the high refractivity layer and the low refractivity layer with each other so as to eliminate interfacial strain in the multi-layered structure in order to produce a separated optical filter device having stable dimension and shape. For example, as understood from the FIG. 3 graph, the combination of high refractive material $Ta_2O_5$ and the low refractive material $SiO_2$ have substantially the same or comparable compression internal stress in a wide range of the ion current density, thereby facilitating substantial elimination strain in the optical filter device of the separated film type.

In the above described embodiments, the samples were prepared by using an electron beam evaporation chamber provided with an ion gun of the 3.5 cm Kaufman type. The ion gun was set to obliquely apply oxygen ions of 750 eV energy to a surface of the substrate at 15° of incident angle. Ion current density was measured by a Faraday cup at the substrate surface. The pressure of the residual gas was set to $2 \times 10^{-4}$ Pa in the background level, and was set to $7 \times 10^{-3}$ Pa during the course of the application of the oxygen ions. The substrate temperature was set to 300° C. and the evaporation distance was set to 400 mm between the evaporation source and the substrate. The growth rate was measured by a quartz crystal thickness gage, and the film thickness was measured by an optical film thickness gage.

Next, FIG. 4 shows the anti-water stability of the optical performance of the sample films which were prepared by the above-described procedure. The anti-water stability of the optical performance was evaluated according to the following test method. Namely, the samples were sealed with silica gel and were stored for 48 hours. Then spectral characteristics of the samples were measured to set reference values at 0% RH. Thereafter, the silica gel was removed and instead supersaturated aqueous solution of $KNO_3$ was placed within the sealing of the samples. After 48 hours, the samples were taken and their spectral characteristics measured. In storage, the humidity was set to 94% RH. The measured values were compared to the reference values to evaluate the anti-water stability of the sample dielectric films in terms of change or shift in spectral wavelength. As understood from the FIG. 4 graph, the low refractivity film of $SiO_2$ and the high refractivity films of $TiO_2$ and $Ta_2O_5$ have the improved anti-water stability or durability when they are deposited by the ion-assist evaporation method in the ion current density range of more than 40 $\mu A/cm^2$. On the other hand, the $ZrO_2$ film shows the improved anti-water stability in a range of more than 90 $\mu A/cm^2$ of the ion current density.

Figure 5:
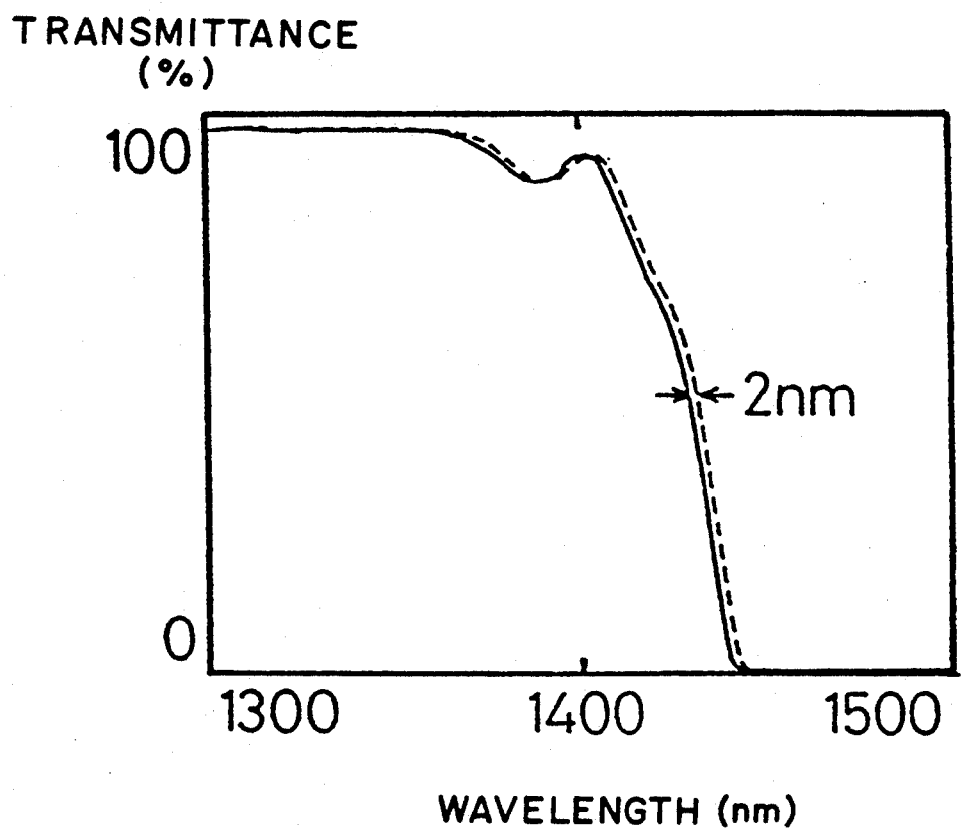
FIG. 5 is a graph showing the relation between transmittance of the multi-layered thin film optical filter device and the wavelength of incident light.

Next there was prepared a sample of an optical filter for evaluation of actual durability in the form of a short wavelength pass filter composed of a multi-layered structure of $SiO_2$ and $Ta_2O_5$, having 1.31 $\mu m$ of transmittance band limit and 1.55 $\mu m$ of cut band limit. Its durability was tested in a manner similar to the FIG. 4 graph, the results of which are shown in a graph of FIG. 5, where the reference data is shown by the solid line at 0% RH, and the compared data is shown by the broken line which was measured after 48 hours of storage of the sample filter at 94% RH. As understood by the comparison, the wavelength shift was only about 2 nm, thereby proving the practical durability of the inventive device.

Hereinbelow, the detailed description is given for various examples of the inventive method for producing an optical filter device free of a substrate. FIGS. 6A–6D are a step diagram showing a first example of the inventive method. In the FIG. 6A step, there is prepared a substrate 6 soluble to a given solvent. In this example, the substrate 6 is in the form of a planar bulk substrate composed of a soluble material. The soluble material may be selected from an NaCl single crystal soluble to water and a metal such as aluminum soluble to acid or alkali. Otherwise, a metal oxide such as alumina may be utilized as a substrate material. The solvent can be selected from a certain etchant as well as acid and alkali. However, the solvent must be selected from a moderate one inactive to optical materials which constitute the filter film.

Figure 6A:
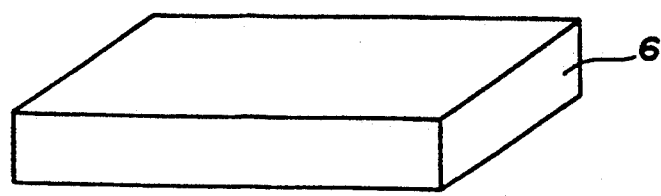
FIGS. 6A-6D are a step diagram showing a first example of the inventive method for producing a multi-layered thin film optical filter device.
Figure 6B:
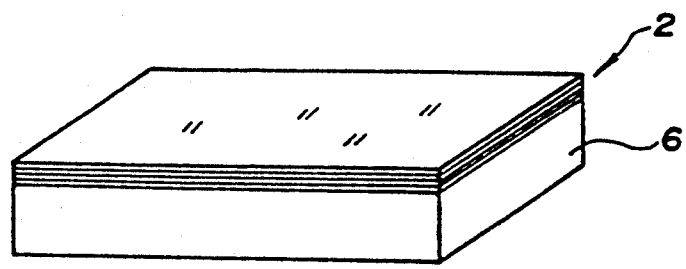

Subsequently in the FIG. 6B step, an optical material of high refractive index and another optical material of low refractive index are alternately deposited on the soluble substrate 6 to form a thin film 2 of multi-layered structure. The deposition could be carried out by the regular or conventional evaporation. However, in such a case the deposited film would be porous and therefore would tend to absorb water molecules. Therefore, there may be preferably utilized an ion-assist evaporation method, ion plating evaporation method or sputtering method in order to deposit a multi-layered film 2 having a dense composition free from absorption of water. These deposition methods utilize accelerated energy particles effective to form a dense refractive layer free from absorption of water. The ion plating method is carried out such that objective particles evaporated by heating with an electron beam are accelerated through plasma and are directed onto the substrate to deposit a film. The high refractivity layer can be formed of a high refractive index material such as $Ta_2O_5$, and the low refractivity layer can be formed of a low refractive index material such as $SiO_2$.

Figure 6C:
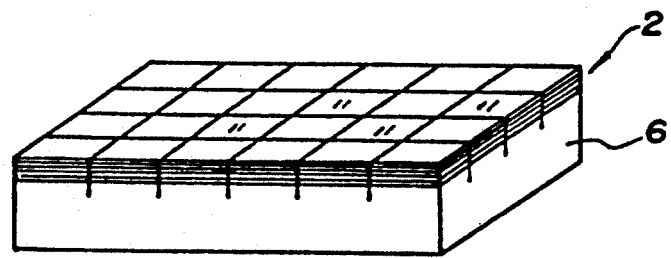

In the FIG. 6C step, the thin film 2 is cut on the soluble substrate 6 to form a plurality of segmented pieces each having a desired dimension. This cutting treatment is carried out by, for example, a wafer scriber normally used in semiconductor device fabrication. At this time, as shown in the figure, it may be preferable to cut deeply into the surface of the soluble substrate 6 through the thin film 2. The cutting is undertaken while being supplied with a coolant which must not dissolve the substrate 6.

Figure 6D:
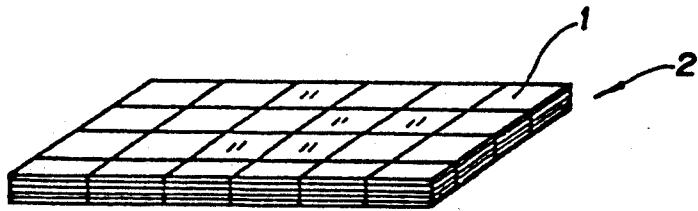

Lastly in the FIG. 6D step, the soluble substrate 6 is dipped into the given solvent to dissolve the substrate 6 to separate or remove the segmented pieces of the thin film 2. Consequently, the segmented pieces are separated to produce optical filter devices 1 free of the substrate. For example, the soluble substrate 6 composed of an NaCl single crystal plate can be dissolved into a solvent composed of water. The soluble substrate composed of aluminum metal can be dissolved into a particular solvent composed of an acid solution.

FIGS. 7A–7E are a step diagram showing a second example of the inventive method for producing an optical filter device of the multi-layered film structure. In the FIG. 7A step, there is prepared a base plate 7 composed of insoluble material.

Figure 7A:
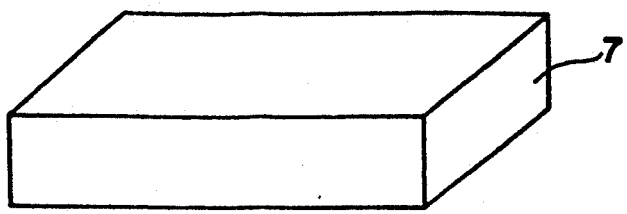
FIGS. 7A-7E are a step diagram showing a second example of the inventive method.
Figure 7B:
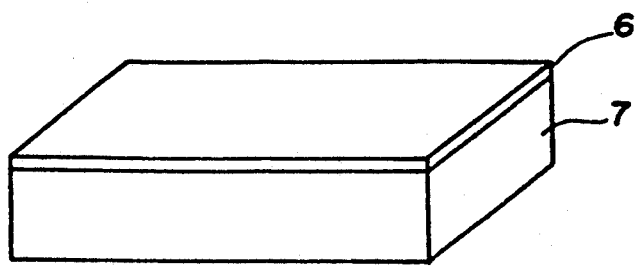

In the FIG. 7B step, a film substrate 6 composed of soluble material is formed on a surface of the base plate 7. This film substrate 6 is obtained by sputtering or evaporation of aluminum metal. This soluble film substrate 6 can be dissolved into a certain solvent.

Figure 7C:
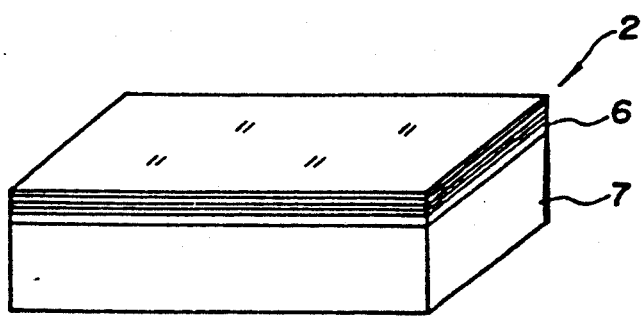

In the FIG. 7C step, a high refractive index material an da low refractive index material are alternately deposited on the film substrate 6 to form a thin film 2 of the multi-layered structure. This deposition step is carried out in a manner similar to the first example of FIGS. 6A–6D.

Figure 7D:
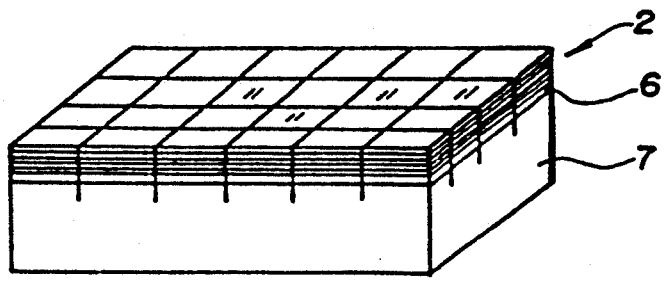

In the FIG. 7D step, the deposited thin film 2 is cut while being supported on the film substrate 6 to form segmented pieces of the thin film 2. This segmentation step is also carried out in a manner similar to the first example. In this example, the film substrate 6 is also cut concurrently through the thin film 2.

Figure 7E:
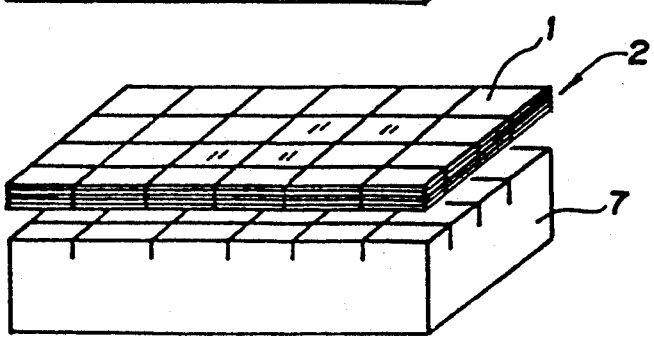

Lastly in the FIG. 7E step, the film substrate is dissolved into the given solvent to remove the segmented pieces of the thin film 2. At this treatment, since the film substrate has also been cut to form therein grooves to expose an edge of the film substrate, the dissolving of the film substrate is facilitated due to a side-etching effect. By such processing, the segmented pieces of the thin film 2 are separated to produce individual optical filter devices 1 of the free type.

Next, the description is given for a modification of the first example shown in FIGS. 6A–6D. First, in the preparation step, there is prepared a substrate soluble to a given solvent. In this modification, the substrate is comprised of a planar bulk substrate having a smooth surface treated by precise polishing work. The planar bulk substrate is composed of a metal element or metal compound such as metal oxide. These materials are advantageous in view of its easy polishing treatment and its easy solubility to cheap and commercial solvents such as acid, alkali and etchant.

Particularly, these selected materials have a surface which would not substantially cause recrystallization by the high energy which will be applied to the substrate in a later step. If recrystallization occurred, a crystal domain would grown on the substrate surface to impair smoothness thereof. When high energy is applied to the substrate during the deposition treatment, the substrate temperature is raised normally to more than 500° C. therefore, there may be preferably selected metal materials or metal oxide materials having a relatively high recrystallization point which exceeds the substrate temperature. Generally, the relation $T_R/T_m = 0.32-0.43 = 1/3$ is held between the recrystallization point $T_R$ and the melting point $T_m$, hence high melting point materials are preferable. The selection of substrate materials must be done also with taking account of whether an adequate solvent is readily available or not. In this modification, the metal substrate material can be selected from Fe, Ni, W and Mo. The metal oxide substrate material can be selected from $Al_2O_3$ and $La_2O_5$. The following table shows the recrystallization point, melting point and suitable solvent for these selected materials. Data of Ai and PbO is also listed for comparison.

TABLE

| MATERIAL | RECRYSTALLIZATION TEMP. (°C.) | MELTING TEMP °C. | SOLVENT |
| --- | --- | --- | --- |
| Fe | 626–723 | 1803 | diluted HCl, diluted $H_2SO_4$ |
| Ni | 873 | 1724 | diluted HCl, diluted $H_2SO_4$ |
| W | less than 1473 | 3630 | thick $HNO_3$ |
| Mo | less than 1173 | 2773 | $HNO_3$ + 3HCl |
| $Al_2O_3$ | — | 2050 | $HPO_3$ base etchant |
| $La_2O_5$ | — | 2000 | $NH_4Cl$ aqueous solution |
| Al | 423–513 | 660 | acid or alkali |
| PbO | 400–450 | 888 | acid or alkali |

Subsequently in the deposition step, a high refractive index material and a low refractive index material are alternately superposed on one another on the planar bulk substrate to form a thin film of the multi-layered structure. The deposition could be carried out by the conventional simple evaporation method. However, in such a case the deposited film has a porous structure which would absorb water. Therefore, it is advisable to use the ion-assist evaporation method, ion plating evaporation method or sputtering method in order to deposit a film having a dense structure free from absorption of water molecules. These deposition methods utilize accelerated energy particles to form a dense refractive layer free from absorption of water. In this modification, the ion plating evaporation is carried out such that the objective material evaporated by electron beam heating is accelerated through a plasma to deposit on the substrate surface. The high refractive index material of $Ta_2O_5$ is utilized to form the high refractivity layer and the low refractive index material of $SiO_2$ is utilized to form the low refractivity layer. When using accelerated energy particles in the growth of a film, high energy is applied to the substrate surface to raise the surface temperature. However, the substrate is composed of material having a relatively high recrystallization point effective to avoid occurrence of recrystallization in the deposition process thereby maintaining the surface smoothness. On the other hand, if low recrystallization point materials such as Al and PbO were selected for the substrate as listed in the table for comparison purpose, recrystallization would progress to cause unevenness at the interface between the substrate and the deposited film.

In the next segmentation step, the thin film is cut into segmented pieces having a desired dimension while being supported on the substrate. This cutting is carried out by a wafer scriber used in semiconductor device fabrication. At this treatment, dividing grooves are preferably formed in the shallow surface portion of the soluble substrate through the superposed thin film. The cutting is effected with the aid of a coolant which must not dissolve the substrate.

Lastly in the separation step, the substrate is dipped into the appropriate solvent to dissolve the substrate and remove the segmented pieces of the thin film. Consequently, the segmented pieces are separated to produce free optical filter devices. The obtained free optical filter device has a smooth surface, which would not cause scattering of incident light thereby ensuring good transmission performance in a set selection wavelength range.

Next, the description is given for a modification of the before described second example. First in the preparation step, there is provided a base plate composed of an insoluble material. Then, a film substrate composed of a soluble material is formed on the surface of the base plate. This film substrate is formed by the sputtering or evaporation of various materials listed in the before-mentioned TABLE. This soluble film substrate can be dissolved into a particular solvent or etching liquid listed in the before-mentioned TABLE.

Subsequently in the deposition step, a high refractive index material and a low refractive index material are alternately superposed on the film substrate to form a thin film having a multi-layered structure. This deposition treatment is carried out in a manner similar to the previous modification and recrystallization of the film substrate would not occur.

In the next segmentation step, the deposited thin film is cut into segmented pieces while being supported on the film substrate. This segmentation process may be carried out in a manner similar to the previous modification. In this modification, it may be preferable to cut the film substrate concurrently with the deposited thin film.

Lastly in the separation step, the film substrate is dissolved into the given solvent to remove the segmented pieces of the filter thin film. At this treatment, since the film substrate is formed with cut grooves to expose edges of the film substrate, the dissolving thereof is facilitated due to a side-etching effect. Particularly, when the film substrate is composed of metal material, a progressing degree of etching can be observed through the transparent filter film. By such treatment, the segmented pieces of the deposited film are separated from the base plate thereby producing free filter devices. The thus obtained filter device has a good transmittance similar to the previous modification.

FIGS. 8A-8D shows a third example of the inventive method for making the optical filter device. In the FIG. 8A step, there is provided a substrate 6 which is soluble to a given solvent. In this example, the substrate 6 is comprised of a planar bulk substrate having a smooth surface treated by fine polishing work. The planar bulk substrate 6 is composed of a metal element or metal compound such as metal oxide. These materials are advantageous in view of easy smoothening and easy solubility to cheap and readily available solvents such as acid, alkali and etchant.

Figure 8A:
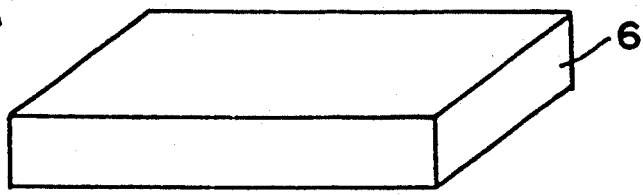
FIGS. 8A-8D are a step diagram showing a third example of the inventive method.
Figure 8B:
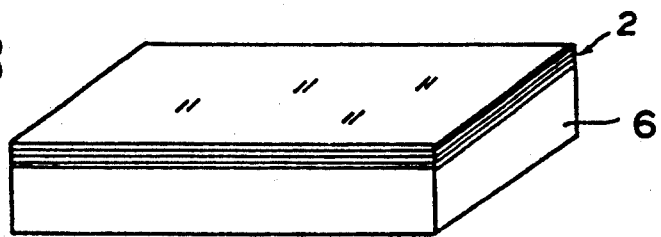

Subsequently in the FIG. 8B step, a high refractive index material and a low refractive index material are alternately deposited on the planar bulk substrate 6 to form a thin film 2 of the multi-layered structure. The deposition could be carried out be simple evaporation method. However, in such a case the deposited film has a porous composition which would absorb water seriously. therefore, ion-assist evaporation, ion plating evaporation or sputtering may be utilized to form the multi-layered thin film 2 having a dense composition effective to block absorption of water. These deposition methods utilize accelerated energy particles so as to form a refractive layer having a dense composition free from absorption of water. In this example, ion plating evaporation is carried out such that the objective material evaporated by electron beam heating is accelerated through the plasma to effect close or tight deposition. The high refractive index material $Ta_2O_5$ is used to form the high refractivity layer, and the low refractive index material $SiO_2$ is used to form the low refractivity layer. While the dense deposited thin film can be grown by utilizing accelerated energy particles, the planar bulk substrate 6 may be curved or bent due to strong compression internal stress generated in the dense film.

Figure 8C:
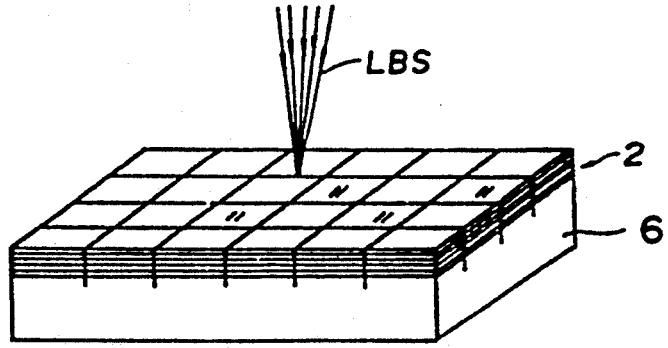

In the FIG. 8C step, the deposited thin film 2 is cut into segmented pieces while being supported on the substrate 6. This cutting treatment is carried out by a noncontact manber using a laser beam spot LBS which can be scanned in the X and Y directions. Accordingly, the thin film 2 can be accurately segmented even if the planar substrate 6 is curved or deformed. Alternatively, the planar substrate 6 may be displaced by means of an X-Y feeding table relative to a fixed laser beam spot LBS to effect cutting. At this treatment, as shown in the figure, cut grooves are formed deeply into the deposited multi-layered film 2 to thereby cut a shallow portion of the soluble substrate 6 concurrently.

Figure 8D:
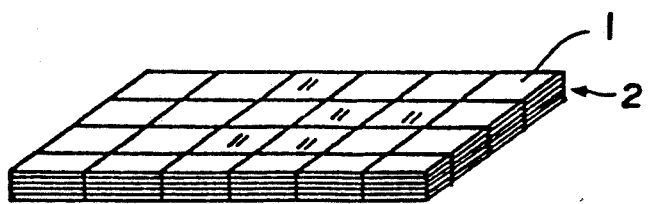

Lastly in the FIG. 8D step, the soluble substrate 6 is dipped into the given solvent to dissolve the same to remove the segmented pieces of the filter film 2. Consequently, the segmented pieces are separated from the substrate to form free filter devices 1.

Figure 9:
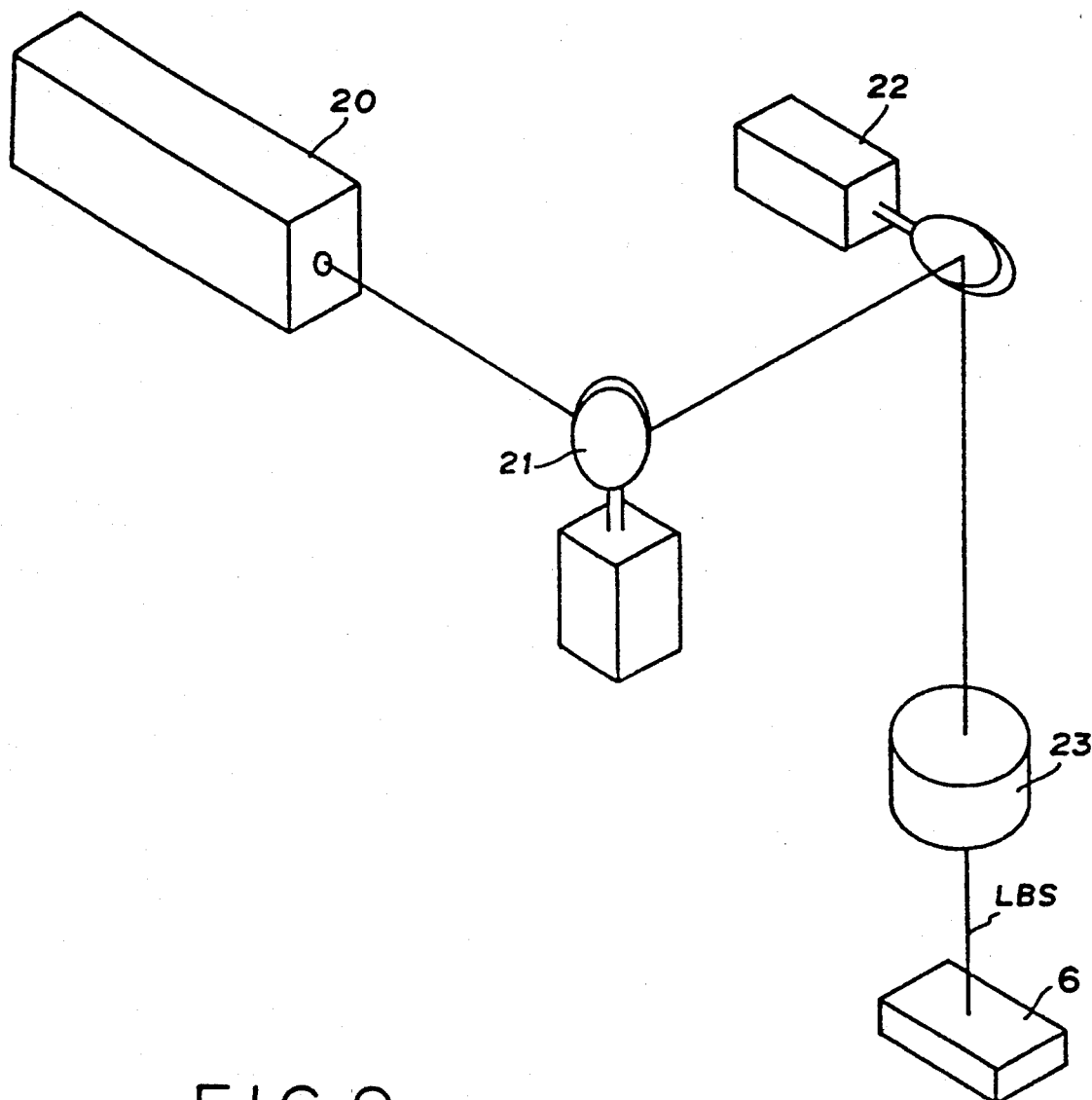
FIG. 9 is a schematic diagram showing a laser processing tool used in the third example of the inventive method.

FIG. 9 is a schematic view of a YAG laser processing instrument used in the above described noncontact segmentation treatment by means of a laser beam spot. As shown in the figure, the instrument is provided with a YAG laser source 20 which can continuously emit a high energy laser beam at an average output value of about 1000 W. A first scanning galvanomirror 21 is disposed in the path of the laser beam to scan the laser beam in the X direction. Further a second scanning galvanomirror 22 is disposed in the path of the laser beam to scan the same in the Y direction. The thus scanned laser beam in the X and Y directions is converged by a focusing lens 23 in the form of a laser beam spot LBS to irradiate a surface of the substrate 6 formed with the optical multi-layered film. The laser beam spot has a diameter on the order of micrometers to impart a quite high density of energy. This laser beam spot is scanned along the given borders of segments so that the irradiated portion of the multi-layered film is heated above the melting point and is then evaporated to form dividing grooves.

As shown in the figure, this cutting process can be carried out in a noncontact manner through the laser beam spot so that the cutting is undertaken accurately along the segment borders without being affected by deformation or curving of the substrate 6. Further, its cut edge face is quite flat and sharp thereby producing optical filter devices having high dimensional accuracy.

On the other hand, if a rotary blade were used to effect dicing and form cutting grooves as in the semiconductor device fabrication, it would be difficult to carry out dicing accurately due to deformation of the substrate because of the physical contact of the rotary blade to the substrate surface. In addition, chipping would occur at edges of the filter film during the course of the cutting process thereby reducing yield rate.

FIGS. 10A-10H show a fourth example of the inventive method for producing a free optical filter device. In the FIG. 10A step, there is prepared a base plate 7 or working plate composed of insoluble material.

Figure 10A:
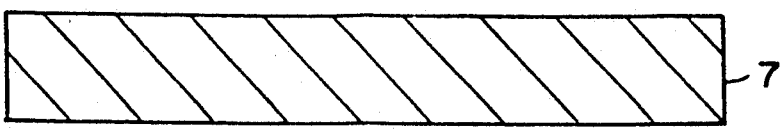
FIGS. 10A-10H are a step diagram showing a fourth example of the inventive method.
Figure 10B:
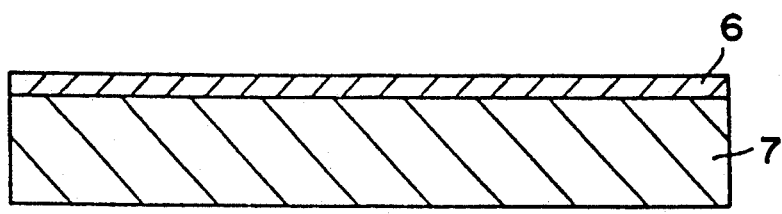

In the FIG. 10B step, a film substrate 6 composed of soluble material is formed over the surface of the base plate 7. This film substrate 6 is formed by, for example, sputtering or evaporation of metal such as Ni. This film substrate 6 is soluble to a given etching liquid.

Figure 10C:
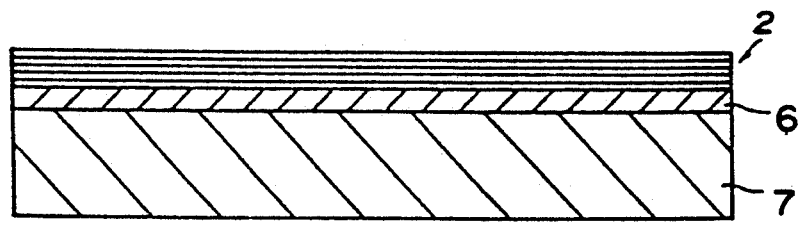

In the FIG. 10C step, a high refractive index material and a low refractive index material are alternately deposited on the film substrate 6 to form a thin film 2 of the multi-layered structure. This deposition process is carried out in a manner similar to the third example. The base plate 7 is curved or deformed due to the strong internal stress in the thin film 2 as in the third example.

Figure 10D:
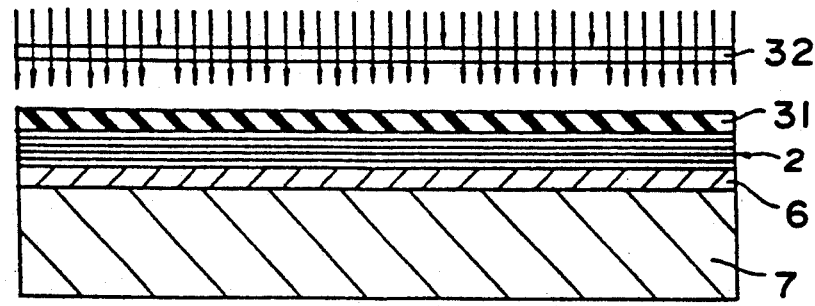
Figure 10E:
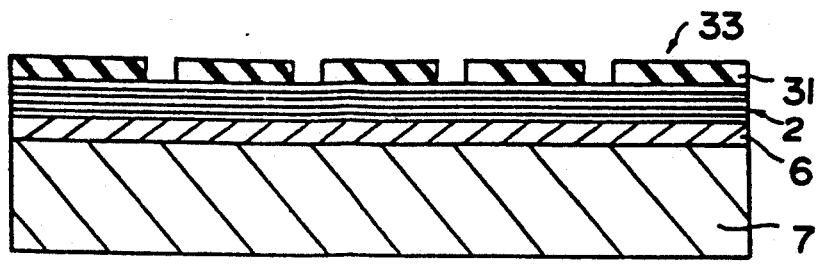
Figure 10F:
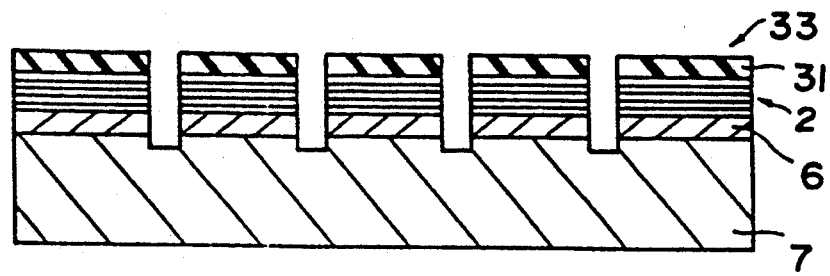

In the FIG. 10D step, a photoresist film 31 to the exposed part of the filter thin film 2, the film substrate 6 and a shallow portion of the base plate 7 to thereby form dividing grooves. Namely, the dividing grooves are formed to border individual device sections 33. The dry etching can be effected by sputtering by using positive Ar ion particles.

Figure 10G:
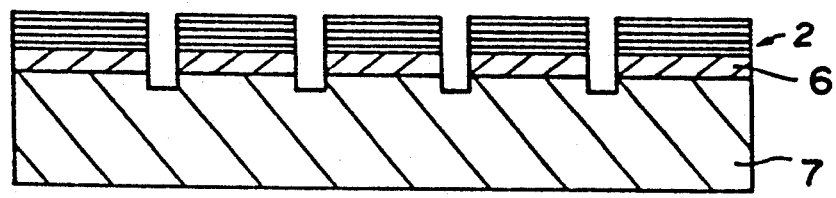
Figure 10H:
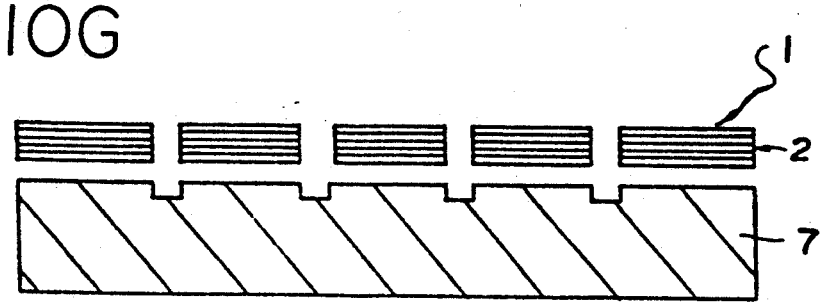

Lastly in the FIG. 10G step, the remaining photoresist film 31 is removed, and thereafter in the FIG. 10H step the film substrate 6 is dissolved into the given solvent to separate the segmented pieces of the filter film 2. At this processing, since the film substrate or coating substrate has been formed with the cutting grooves to expose its side edges, the coating substrate is quickly or efficiently dissolved due to a side-etching effect. By such treatment, the segmented pieces of the thin film 2 are removed to obtain individual free filter devices 1.

FIGS. 11A-11F show a fifth example of the inventive method for producing an optical filter device of the multi-layered structure type. In the FIGS. 11a step, there is provided a substrate 6 soluble to a given solvent. In this example, the substrate 6 is comprised of a planar bulk substrate composed of a soluble material. The soluble material may be selected from an NaCl single crystal soluble to water and a metal such as Al soluble to acid or alkali. Otherwise, the substrate may be composed of metal oxide such as alumina. The solvent may be selected from a particular etchant, an acid and an alkali. However, the solvent must not affect optical materials which constitute the filter device.

Figure 11A:
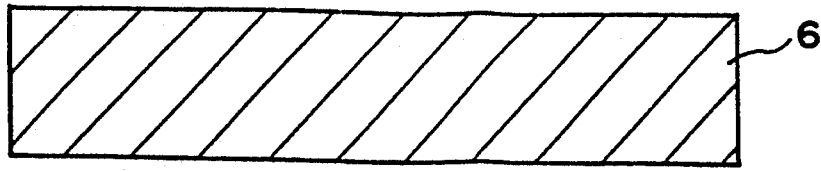
FIGS. 11A-11F are a step diagram showing a fifth example of the inventive method.
Figure 11B:
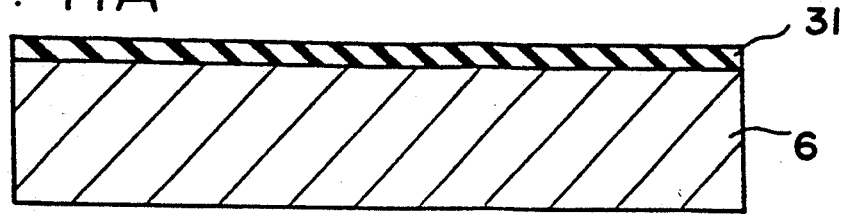

In the FIG. 11B step, a photoresist film 31 is uniformly coated over the surface of the soluble substrate 6 or working carrier.

Figure 11C:
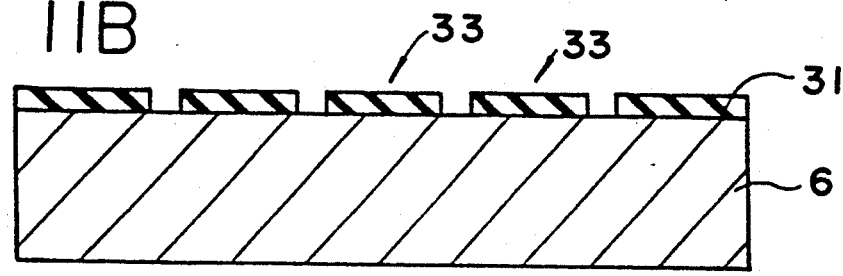

Further in the FIG. 11C step, a photomask formed with a device section pattern of predetermined dimension and shape is placed in close contact with the photoresist film 31 so as to effect exposure and development. Then the photoresist film 31 is partly removed in section other than the device sections 33 or device regions. The photolithography is applied to the substrate 6 which is not yet applied with strong internal stress which would cause curving or deforming of the substrate 6, so that the photomask can be closely placed to the substrate to enable easy and accurate patterning of the device sections. The photolithography is particularly suitable for producing a highly precise device or a circular device.

Figure 11D:
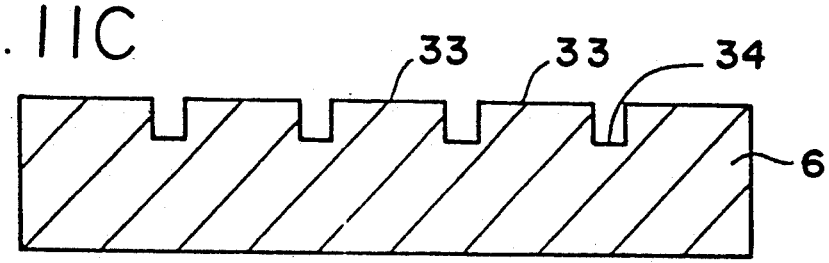

In the following FIG. 11D step, dry etching or wet etching is effected through the patterned photoresist film 31 to an exposed part of the substrate surface to form dividing grooves 34. Namely, the dividing grooves 34 are formed to border each device section 33.

Figure 11E:
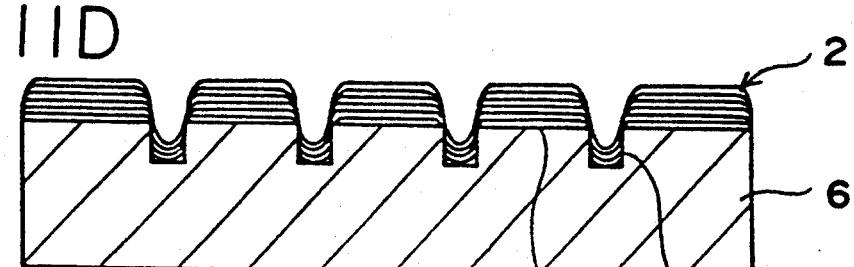

Then in the FIG. 11E step, a high refractive index material and a low refractive index material are alternately deposited on the soluble substrate 6 formed with the device sections 33 to form a filter thin film 2 having a multi-layered structure. The deposition may be carried out by simple vacuum evaporation. However, in such a case the deposited film has a porous composition which may absorb water molecules. Therefore, preferably an ion-assist evaporation method, ion plating evaporation method or sputtering method is utilized to form a multi-layered film 2 having a dense composition effective to avoid absorption of water molecules. These deposition methods utilize accelerated energy particles in order to form the dense composition of a refractive layer free from absorption of water. In this example, the ion plating evaporation is effected such that an optical material is evaporated by electron beam heating and is then accelerated through a plasma to form a deposited film. A high refractive index material of $Ta_2O_5$ is utilized to form a high refractivity layer, and a low refractivity index material of $SiO_2$ is utilized to form a low refractivity layer. As shown in the figure, the depth of the dividing grooves 34 is set greater than a thickness of the deposited thin film 2, hence the multi-layered thin film 2 is deposited in registration with the device sections 33 so that the film 2 is segmented by the dividing grooves 34. Further, the side wall of the dividing grooves is exposed or slightly covered by the optical material after the deposition treatment because of poor step coverage due to unidirectional evaporation.

Figure 11F:

Lastly in the FIG. 11F step, the soluble substrate 6 is dipped and dissolved into the given solvent to remove the segmented pieces of the optical filter thin film 2 which is dived by the grooves 34 in registration with the device sections. Consequently, the segmented pieces of the thin film are separated to obtain free optical filter devices 1. For example, if the soluble substrate 6 is composed of an NaCl single crystal, water can be used as the given solvent. Otherwise, if the soluble substrate 6 is composed of an aluminum metal plate, an acid may be used as an efficient solvent. In this step, the side wall of dividing grooves 34 is almost exposed such that the filter thin film 2 is substantially divided into segments, thereby easily obtaining individual filter devices.

FIGS. 12A-12E show a sixth example of the inventive method for producing a multi-layered optical filter device. In the FIG. 12A step, there is provided a base plate 7 composed of an insoluble material.

Figure 12A:
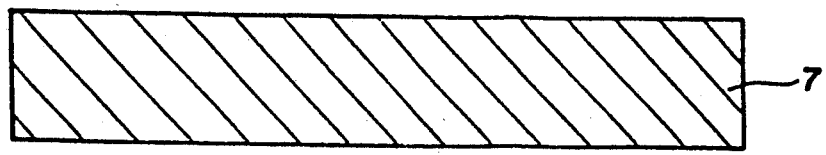
FIGS. 12A-12E are a step diagram showing a sixth example of the inventive method.
Figure 12B:
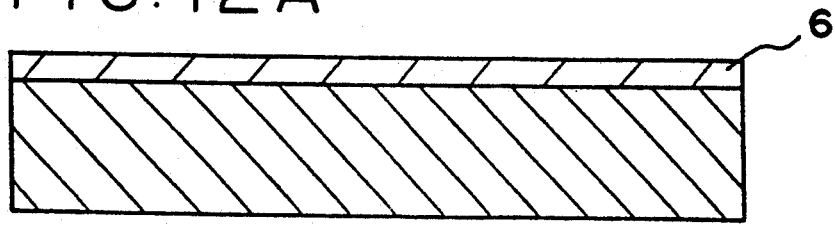

In the FIG. 12B step, a film or coat substrate 6 composed of soluble material is formed on the base plate 7. This coat substrate 6 is formed by sputtering or evaporation of metal Ni. This film substrate 6 is soluble to a given etching liquid.

Figure 12C:
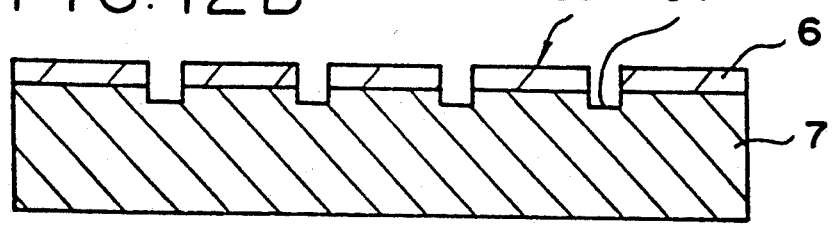

In the FIG. 12C step, dividing grooves 34 are formed in the film substrate 6 to provide a plurality of device sections 33. In this example, the dividing grooves are formed by means of dicing used in semiconductor device fabrication. The dicing is particularly suitable for providing rectangular device sections. The dicing is carried out to cut into a shallow portion of the base plate 7 through the film substrate 6. In this example, the dicing is carried out while the base plate 7 and the film substrate 6 do not yet receive any stress, thereby enabling accurate processing and easy working.

Figure 12D:
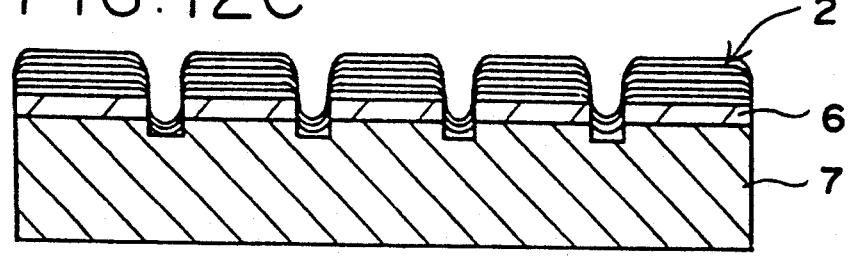

In the FIG. 12D step, a high refractive index material and a low refractive index material are alternately deposited on the divided film substrate 6 to form a thin film 2 of the multi-layered structure. This deposition is carried out in manner similar to the fifth example. In this treatment, the thin film 2 is segmented in registration with the device sections, and the side edge of the cut film substrate 6 is almost exposed or slightly covered by the optical material due to poor step coverage.

Figure 12E:
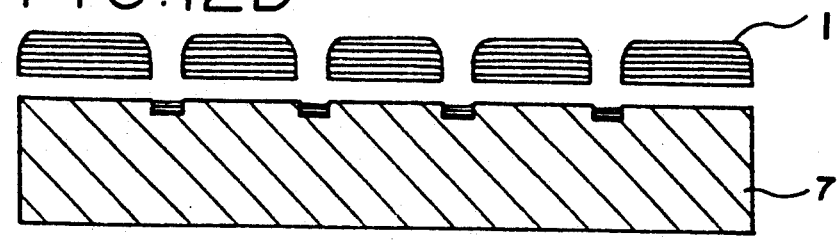

Lastly in the FIG. 12E step, the film substrate 6 is dissolved into the given solvent to remove the segmented pieces of the thin film 2. In this treatment, since the film substrate 6 has been cut and its edge has been almost exposed even after the deposition treatment, the film substrate 6 is quickly dissolved due to side-etching effect. By such treatment, the segmented pieces of the thin film 2 are removed from the base plate 7 to obtain individual free optical filter devices 1.

FIGS. 13A-13E show a seventh example of the inventive method for making a free optical filter device.

Figure 13A:
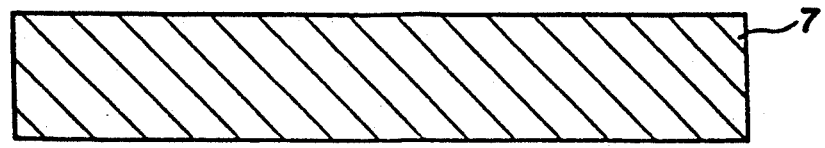
FIGS. 13A-13E are a step diagram showing a seventh example of the inventive method of producing a multi-layered thin film optical filter device.

In the FIG. 13A step, there is prepared a base plate 7 or working plate composed of insoluble material.

Figure 13B:
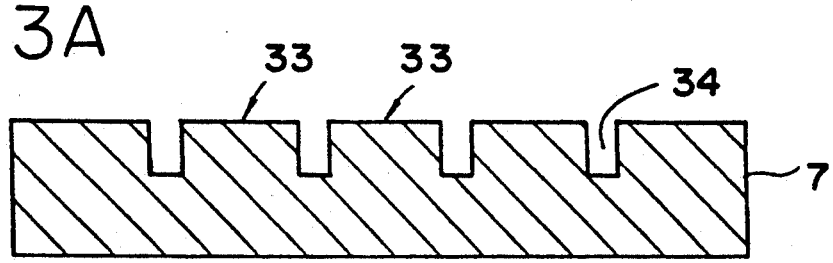

In the FIG. 13B step, dividing grooves 34 are formed in a surface of the base plate 7 by etching or dicing to define device sections 33. The grooves are provided in a horizontal face of the base plate 7 which is not yet applied with internal stress to thereby ensure high accuracy and good workability.

Figure 13C:
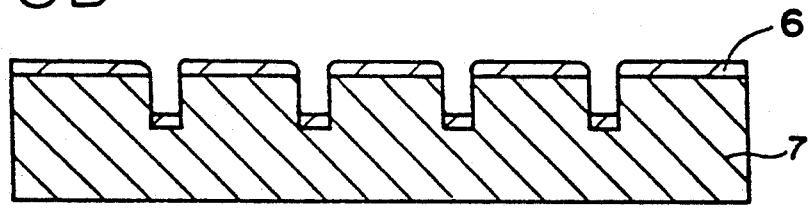

In the FIG. 13C step, a film or coat substrate 6 is formed on a divided surface of the base plate 7. This film substrate 6 is deposited by sputtering or evaporation of metal such as aluminum. This film substrate 6 is soluble to a given etching solution. In this example, the dividing grooves are formed prior to the deposition of the film substrate 6 in contact to the previously described sixth example. Consequently, the deposition of the film substrate 6 and the following deposition of the optical filter film can be continuously carried out advantageously. Namely, the film substrate 6 and the optical filter film can be formed successively in the same vacuum chamber.

Figure 13D:
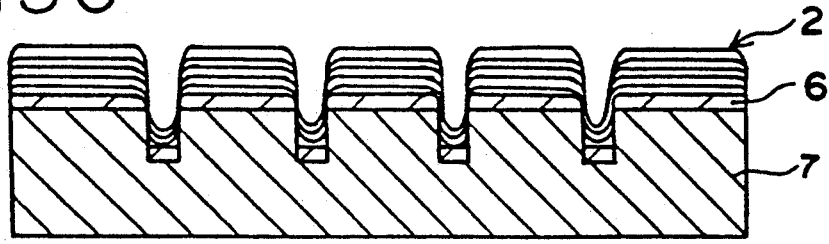

In the FIG. 13D step, a high refractive index material and a low refractive index material are alternately deposited on the divided film substrate 6 to form an optical filter thin film 2 of the multi-layered structure.

Figure 13E:
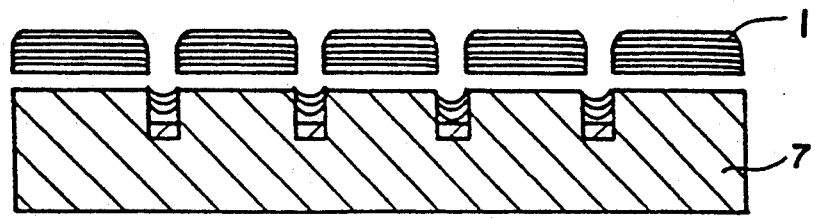

Lastly, in the FIG. 13E step, the film substrate 6 is dissolved into the given solvent to remove segmented pieces of the thin film 2 which has been segmented along the dividing grooves. In this treatment, since the edges of the film substrate 6 are substantially exposed at the side walls of the dividing grooves, the film substrate can be quickly dissolved into the solvent due to the side-etching effect. Even if the edges of the film substrate 6 are slightly covered by the deposited optical materials, the solvent or etching liquid can pass through such coatings. By such processing, the segmented pieces of the filter thin film 2 are removed from the base plate 7 to produce individual free optical filter devices 1.

What is claimed is:

1. An optical filter comprising a thin film being free of a substrate and having a multi-layered structure comprised of a high refractivity layer having a certain internal stress, and a low refractivity layer having substantially the same internal stress as that of the high refractivity layer and being superposed alternately to the high refractivity layer, the refractivity layer being composed of relatively high refractivity inorganic material deposited by accelerated energy particles to a dense composition effective to prevent absorption of water, the low refractivity layer being composed of relatively low refractivity inorganic material also deposited by accelerated energy particles to a dense composition effective to prevent absorption of water.

2. An optical filter according to claim 1; wherein the thin film includes an adjusting layer having a thickness effective to adjust a total thickness of the multi-layered structure.

3. An optical filter according to claim 1; wherein the high refractivity layer has a certain compression internal stress and the low refractivity layer has substantially the same compression internal stress as that of the high refractivity layer.

4. An optical filter according to claim 3; wherein the high refractivity layer is comprised of a densely deposited layer composed of $Ta_2O_5$, and the low refractivity layer is comprised of another densely deposited layer composed of $SiO_2$.

5. An optical filter produced by a method comprising a step of providing a substrate soluble to a solvent; a deposition step of alternatively depositing an inorganic optical material having high refractive index and another inorganic optical material having low refractive index on the soluble substrate to form a thin film having multi-layered structure, each layer having substantially the same internal stress and being deposited by accelerated energy particles to a dense composition effective to prevent absorption of water; and a separation step of dissolving the substrate and the solvent to separate the thin film to form an optical filter free of the substrate.

6. An optical filter produced by the method according to claim 5
wherein the deposition step comprises depositing alternately one optical material exhibiting a certain compressive internal stress in the multilayered structure and another optical material exhibiting substantially the same compressive internal stress as that of said one optical material in the multi-layered structure.

7. An optical filter produced by the method according to claim 6,
wherein the deposition step comprises depositing alternately one optical material composed of $Ta_2O_5$ and another optical material composed of $SiO_2$.

8. An optical filter produced by the method according to claim 5,
wherein the method further includes the segmentation step of effecting segmentation treatment prior to the separation step to form an optical filter comprised of a segmented piece of thin film.

* * * * *